(12) United States Patent
Hopkins et al.

(10) Patent No.: US 12,185,544 B2
(45) Date of Patent: Dec. 31, 2024

(54) INTEGRATED ASSEMBLIES HAVING VERTICALLY-SPACED CHANNEL MATERIAL SEGMENTS, AND METHODS OF FORMING INTEGRATED ASSEMBLIES

(71) Applicant: Lodestar Licensing Group LLC, Evanston, IL (US)

(72) Inventors: John D. Hopkins, Meridian, ID (US); Shyam Surthi, Boise, ID (US); Jordan D. Greenlee, Boise, ID (US)

(*) Notice: Subject to any disclaimer, the term of this patent is extended or adjusted under 35 U.S.C. 154(b) by 0 days.

(21) Appl. No.: 17/867,501

(22) Filed: Jul. 18, 2022

(65) Prior Publication Data

US 2022/0359565 A1 Nov. 10, 2022

Related U.S. Application Data

(60) Continuation of application No. 17/230,541, filed on Apr. 14, 2021, now Pat. No. 11,417,682, which is a
(Continued)

(51) Int. Cl.
*H10B 43/27* (2023.01)
*H01L 21/02* (2006.01)
(Continued)

(52) U.S. Cl.
CPC ......... *H10B 43/27* (2023.02); *H01L 21/0214* (2013.01); *H01L 21/02164* (2013.01);
(Continued)

(58) Field of Classification Search
None
See application file for complete search history.

(56) References Cited

U.S. PATENT DOCUMENTS 9,257,641 B2 2/2016 Chen et al.
9,589,982 B1 3/2017 Cheng et al.
(Continued)

FOREIGN PATENT DOCUMENTS

KR 10-2011-0128717 11/2011
TW 201519427 5/2015
(Continued)

OTHER PUBLICATIONS

WO PCT/US2020/044079 Written Opin, Nov. 13, 2020, Micron Technology, Inc.
(Continued)

*Primary Examiner* — Khaja Ahmad
(74) *Attorney, Agent, or Firm* — Brooks, Cameron & Huebsch, PLLC

(57) ABSTRACT

Some embodiments include a NAND memory array having a vertical stack of alternating insulative levels and conductive levels. The conductive levels include terminal regions, and include nonterminal regions proximate the terminal regions. The terminal regions are vertically thicker than the nonterminal regions, and are configured as segments which are vertically stacked one atop another and which are vertically spaced from one another. Blocks are adjacent to the segments and have approximately a same vertical thickness as the segments. The blocks include high-k dielectric material, charge-blocking material and charge-storage material. Channel material extends vertically along the stack and is adjacent to the blocks. Some embodiments include integrated assemblies. Some embodiments include methods of forming integrated assemblies.

16 Claims, 18 Drawing Sheets

Related U.S. Application Data division of application No. 16/548,471, filed on Aug. 22, 2019, now Pat. No. 11,024,644.

(51) Int. Cl.

| | | |
|---|---|---|
| *H01L 21/28* | (2006.01) | |
| *H01L 29/49* | (2006.01) | |
| *H01L 29/51* | (2006.01) | |
| *H01L 29/788* | (2006.01) | |
| *H01L 29/792* | (2006.01) | |
| *H10B 41/27* | (2023.01) | |

(52) U.S. Cl.
CPC .... *H01L 21/0217* (2013.01); *H01L 29/40114* (2019.08); *H01L 29/40117* (2019.08); *H01L 29/495* (2013.01); *H01L 29/4966* (2013.01); *H01L 29/4975* (2013.01); *H01L 29/4991* (2013.01); *H01L 29/513* (2013.01); *H01L 29/517* (2013.01); *H01L 29/7883* (2013.01); *H01L 29/792* (2013.01); *H10B 41/27* (2023.02)

(56) References Cited

U.S. PATENT DOCUMENTS

| | | | |
|---|---|---|---|
| 9,773,807 B1 | 9/2017 | Bandyopadhyay | |
| 9,985,049 B1* | 5/2018 | Sandhu | H01L 29/40117 |
| 10,038,008 B1 | 7/2018 | Hopkins et al. | |
| 10,930,663 B2 | 2/2021 | Lu et al. | |
| 2011/0287612 A1* | 11/2011 | Lee | H10B 43/10 |
| | | | 257/E21.09 |
| 2011/0298037 A1* | 12/2011 | Choe | G11C 16/0483 |
| | | | 257/314 |
| 2014/0048868 A1 | 2/2014 | Kim et al. | |
| 2014/0353738 A1 | 12/2014 | Makala et al. | |
| 2015/0294980 A1* | 10/2015 | Lee | H10B 43/27 |
| | | | 438/591 |
| 2016/0086964 A1* | 3/2016 | Chien | H10B 43/27 |
| | | | 438/269 |
| 2016/0099323 A1 | 4/2016 | Hopkins | |
| 2017/0098659 A1 | 4/2017 | Yoshimizu et al. | |
| 2018/0033799 A1* | 2/2018 | Kanamori | H10B 43/35 |
| 2018/0151588 A1* | 5/2018 | Tsutsumi | H01L 21/0228 |
| 2018/0219017 A1 | 8/2018 | Goda et al. | |
| 2018/0219020 A1* | 8/2018 | Hopkins | H10B 43/27 |
| 2018/0219021 A1 | 8/2018 | Daycock et al. | |
| 2018/0026922 A1 | 9/2018 | Huang et al. | |
| 2018/0286883 A1 | 10/2018 | Hopkins et al. | |
| 2019/0051656 A1 | 2/2019 | Carlson et al. | |

FOREIGN PATENT DOCUMENTS

| | | |
|---|---|---|
| TW | 201606993 | 2/2016 |
| TW | 201711138 | 3/2017 |
| TW | 201834207 | 9/2018 |
| TW | 201836128 | 10/2018 |
| WO | WO PCT/US2020/044079 | 2/2022 |

OTHER PUBLICATIONS

TW TW 109127309 Search Rept Trans, Apr. 8, 2021, Micron Technology Inc.

* cited by examiner

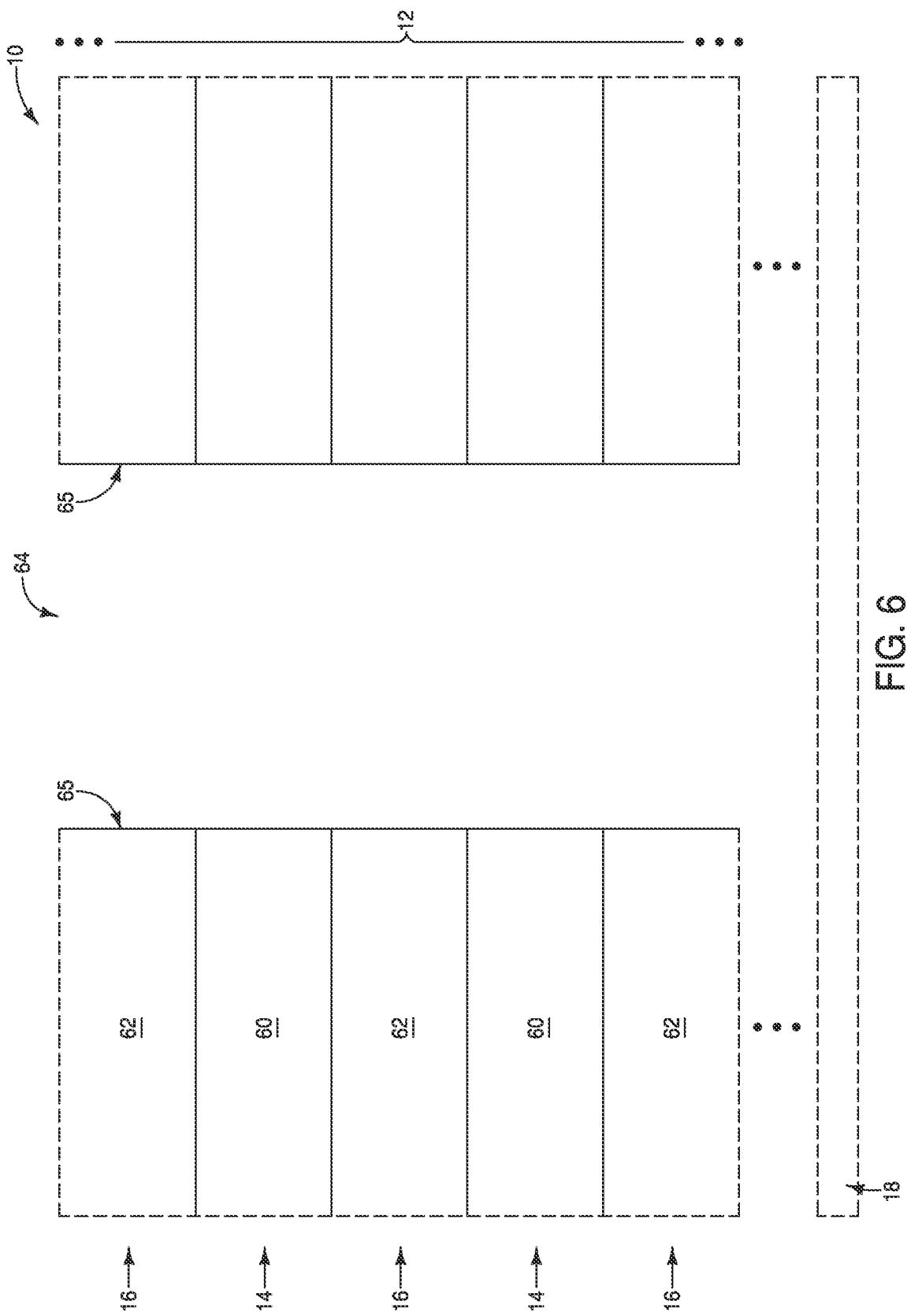

INTEGRATED ASSEMBLIES HAVING VERTICALLY-SPACED CHANNEL MATERIAL SEGMENTS, AND METHODS OF FORMING INTEGRATED ASSEMBLIES

RELATED PATENT DATA

This patent application is a continuation of and claims priority to U.S. patent application Ser. No. 17/230,541, filed Apr. 14, 2021, which is a divisional application of U.S. patent application Ser. No. 16/548,471, filed Aug. 22, 2019, now U.S. Pat. No. 11,024,644, issued Jun. 1, 2021, the disclosures of which are incorporated by reference.

TECHNICAL FIELD

Integrated assemblies (e.g., integrated NAND memory) having vertically-spaced channel material segments, and methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device 2101 is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved NAND architecture and improved methods for fabricating NAND architecture.

BRIEF DESCRIPTION OF THE DRAWINGS

FIGS. 5 and 6 are diagrammatic cross-sectional side views of a region of an integrated assembly shown at example sequential process stages of an example method for forming an example NAND memory array.

DETAILED DESCRIPTION OF THE ILLUSTRATED EMBODIMENTS

Operation of NAND memory cells comprises movement of charge between a channel material and a charge-storage material. For instance, programming of a NAND memory cell may comprise moving charge (i.e., electrons) from the channel material into the charge-storage material, and then storing the charge within the charge-storage material. Erasing of the NAND memory cell may comprise moving holes into the charge-storage material to recombine with the electrons stored in the charge-storage material, and to thereby release charge from the charge-storage material. The charge-storage material may comprise charge-trapping material (for instance, silicon nitride, metal dots, etc.). A problem with conventional NAND can be that charge-trapping material extends across multiple memory cells of a memory array, and such can lead to charge migration from one memory cell to another. The charge migration may lead to data retention problems. Some embodiments include NAND architectures having breaks in the charge-trapping material in regions between memory cells; and such breaks may advantageously impede migration of charge between memory cells. Example embodiments are described with reference to FIGS. 5-16.

Figure 1:
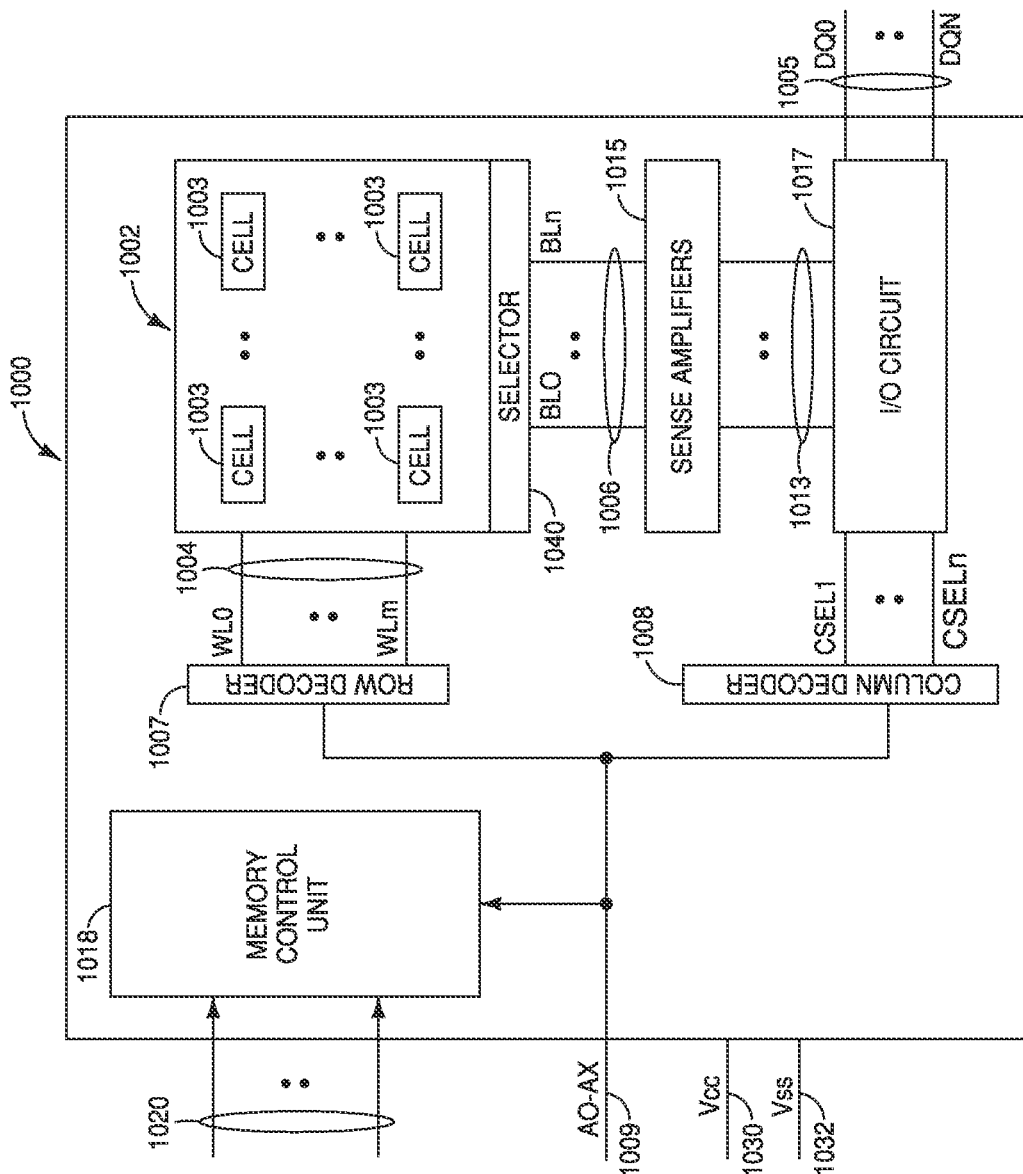
FIG. 1 shows a block diagram of a prior art memory device having a memory array with memory cells.
Figure 2:
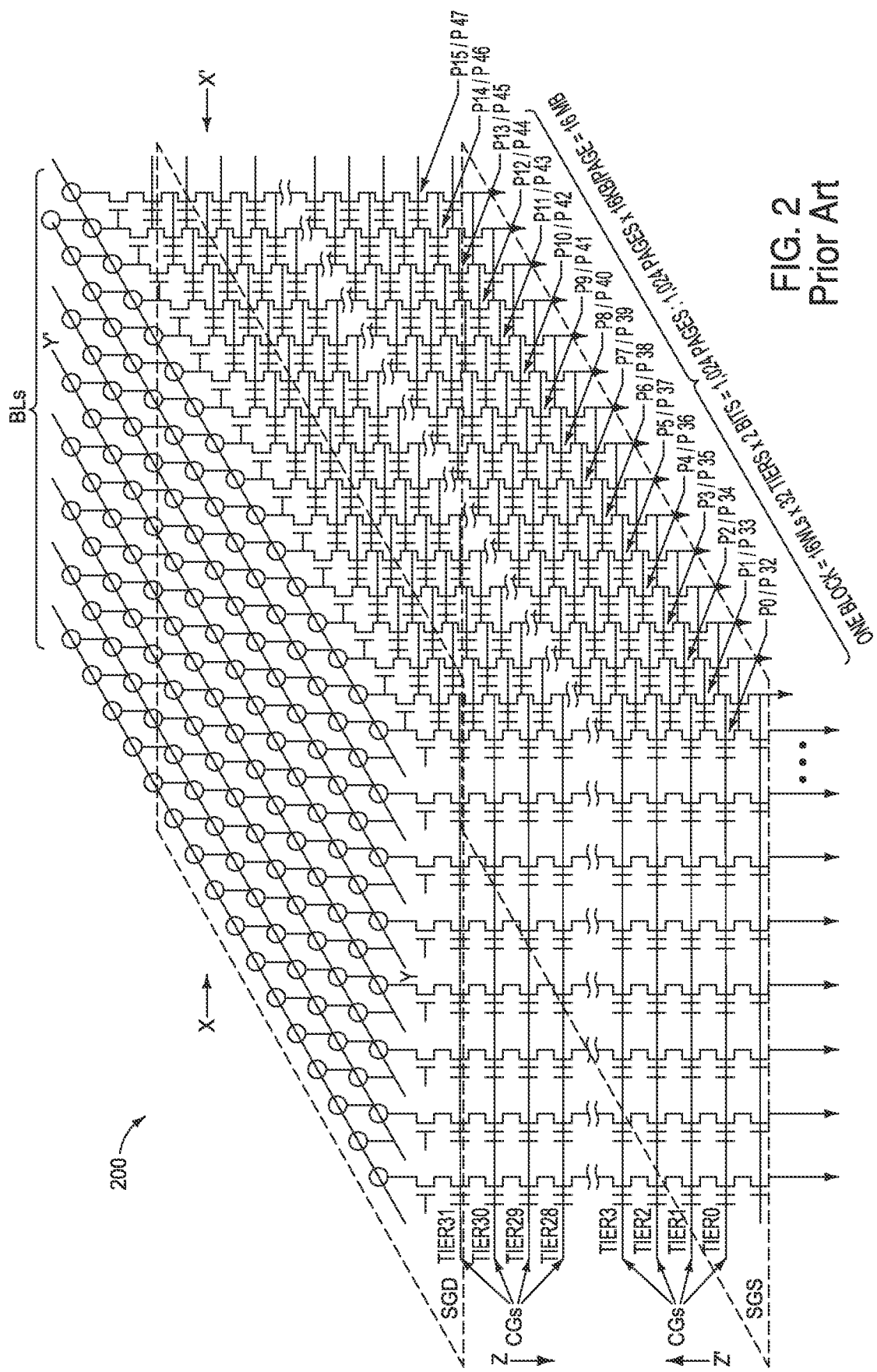
FIG. 2 shows a schematic diagram of the prior art memory array of FIG. 1 in the form of a 3D NAND memory device.
Figure 3:
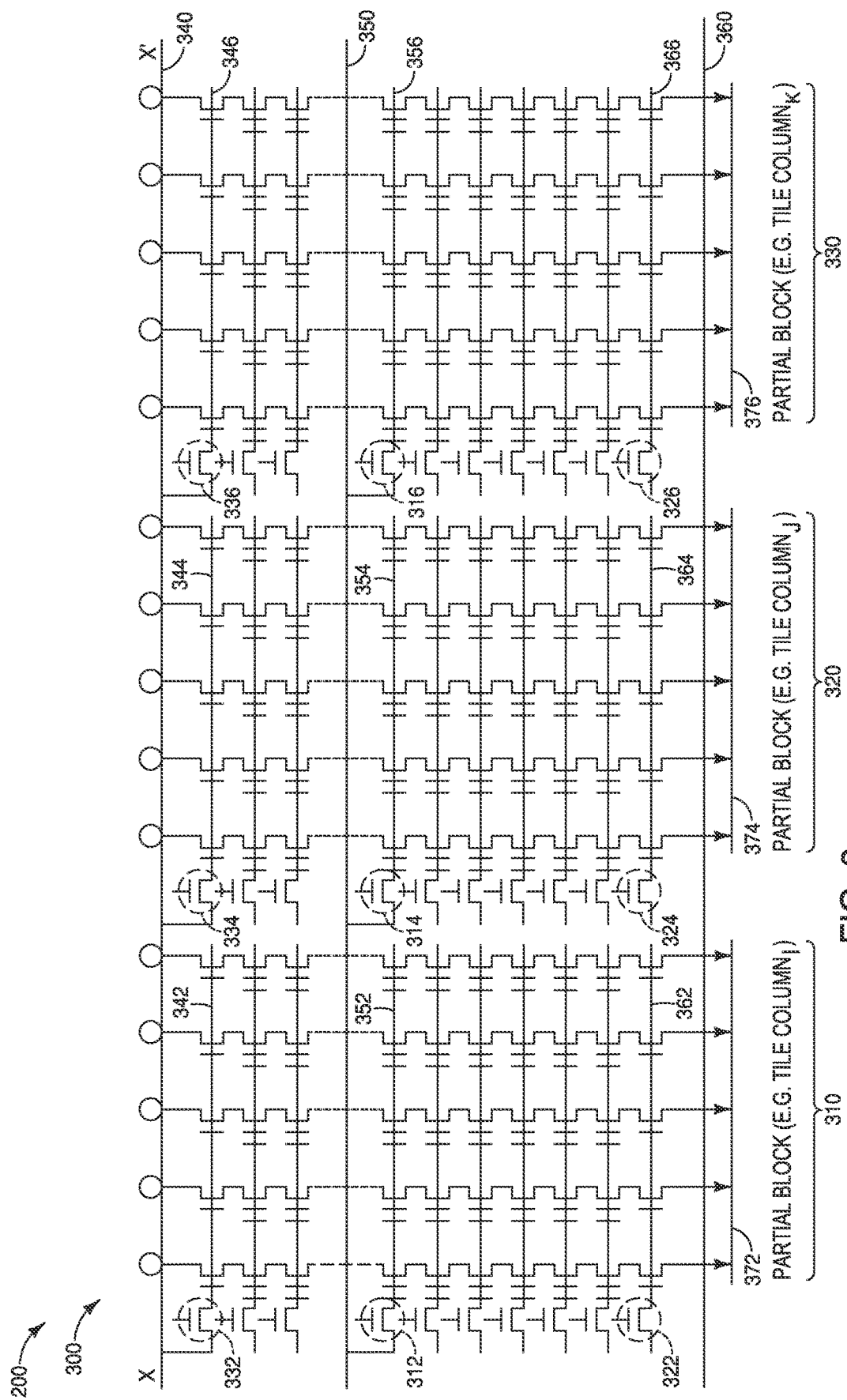
FIG. 3 shows a cross-sectional view of the prior art 3D NAND memory device of FIG. 2 in an X-X' direction.
Figure 4:
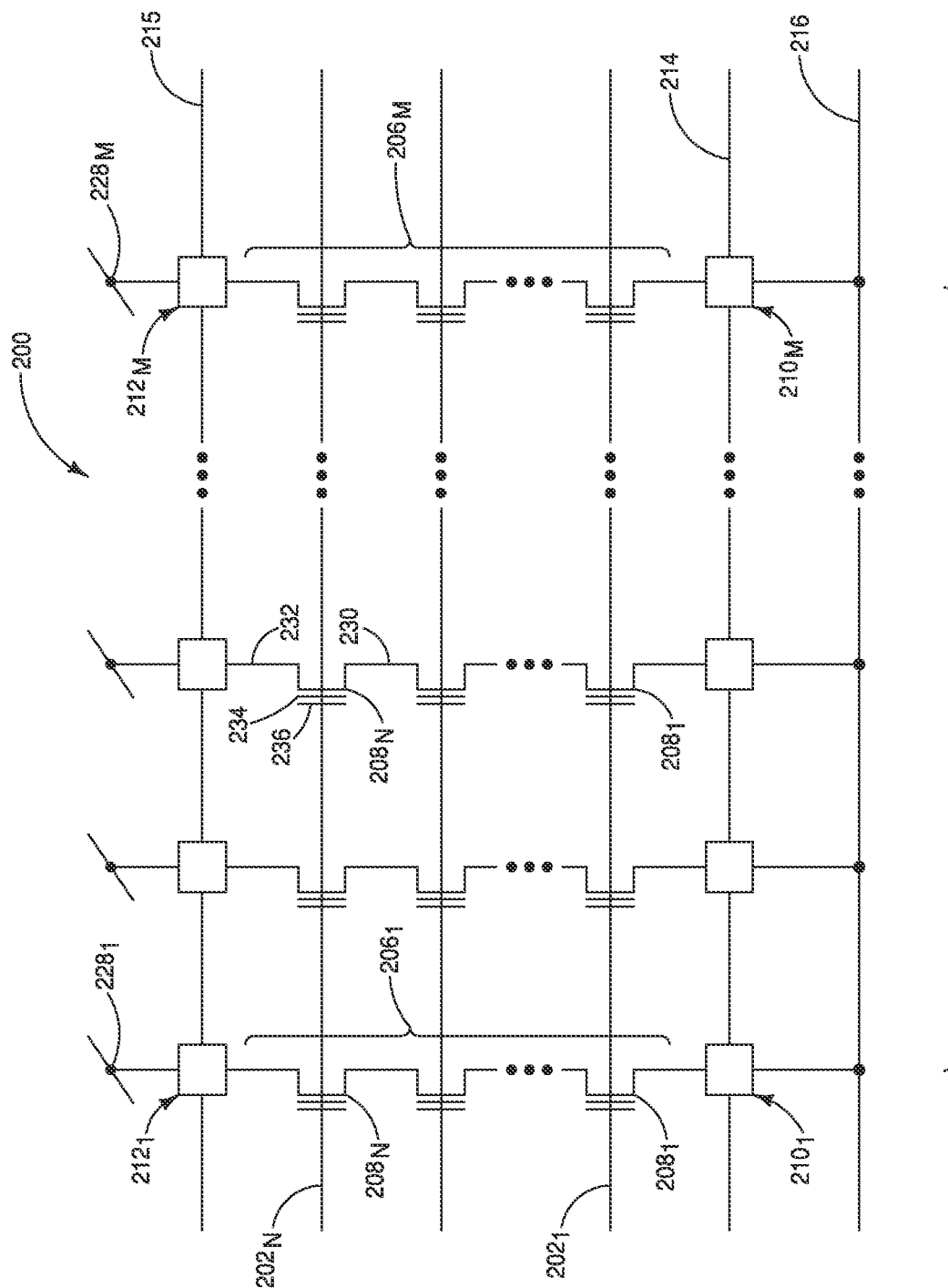
FIG. 4 is a schematic diagram of a prior art NAND memory array.
Figure 5:
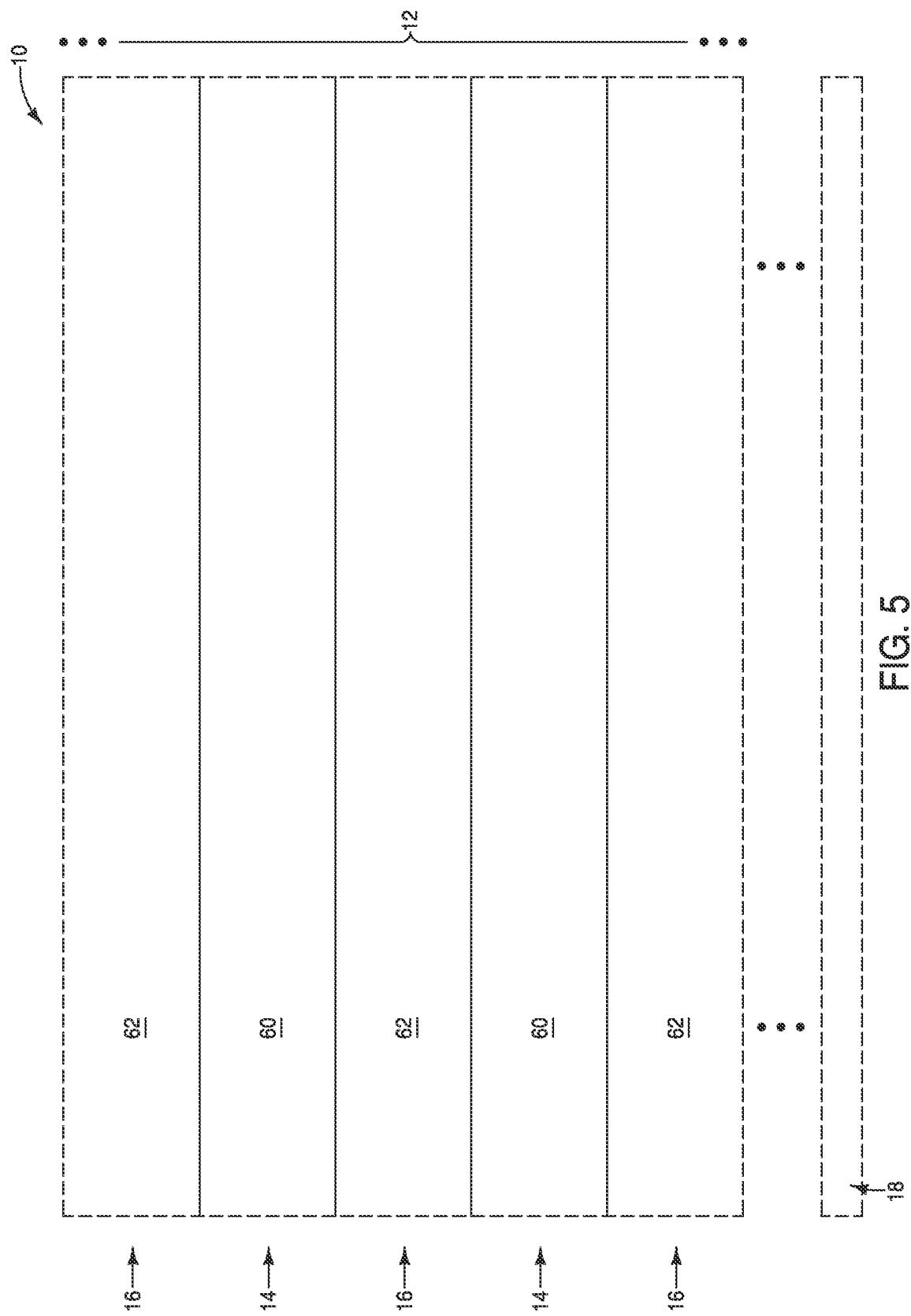

Referring to FIG. 5, a construction (integrated assembly, integrated structure) 10 includes a vertical stack 12 of alternating first and second levels 14 and 16. The first levels 14 comprise a first material 60, and the second levels 16 comprise a second material 62. The first and second materials may comprise any suitable compositions, and are of different compositions relative to one another. In some embodiments, the first material 60 may comprise, consist essentially of, or consist of silicon dioxide; and the second material 62 may comprise, consist essentially of, or consist of silicon nitride. The levels 14 and 16 may be of any suitable thicknesses; and may be the same thickness as one another, or may be different thicknesses relative to one another. In some embodiments, the levels 14 and 16 may have vertical thicknesses within a range of from about 10 nanometers (nm) to about 400 nm. In some embodiments, the levels 14 and 16 may have thicknesses within a range of from about 10 nm to about 50 nm.

The stack 12 is shown to be supported over a base 18. The base 18 may comprise semiconductor material; and may, for example, comprise, consist essentially of, or consist of monocrystalline silicon. The base 18 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 18 may correspond to a semiconductor substrate containing one or more materials associated with integrated circuit fabrication. Such materials may include, for example, one or more of refractory metal materials, barrier materials, diffusion materials, insulator materials, etc.

A gap is provided between the stack 12 and the base 18 to indicate that other components and materials may be provided between the stack 12 and the base 18. Such other components and materials may comprise additional levels of the stack, a source line level, source-side select gates (SGSs), etc.

Figure 6A:
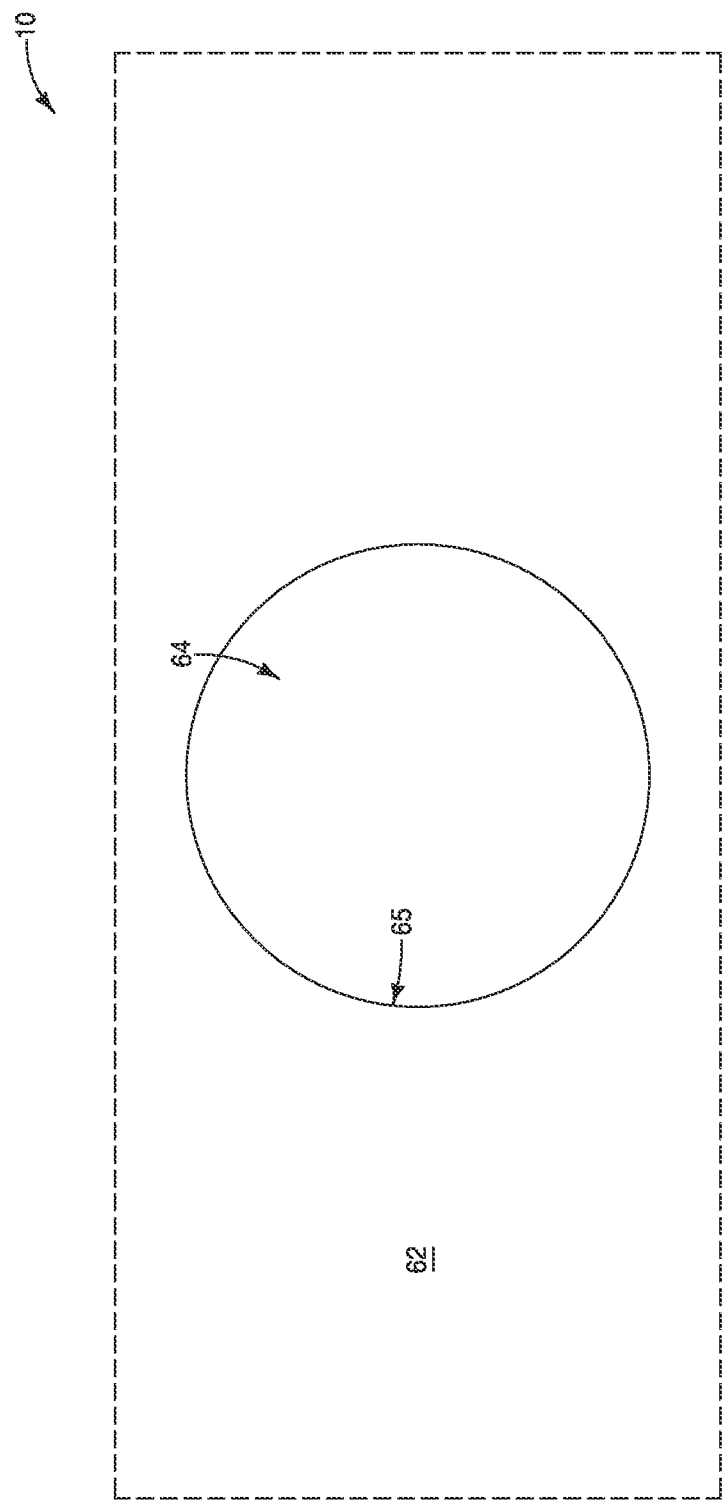
FIG. 6A is a diagrammatic top view of a portion of the integrated assembly of FIG. 6.

Referring to FIG. 6, an opening 64 is formed to extend through the stack 12. The opening 64 has sidewalls 65 extending along the first and second materials 60 and 62. The opening 64 may have a closed shape (circular, elliptical, polygonal, etc.) when viewed from above (as shown in FIG. 6A), and the sidewalls 65 shown in the cross-section of FIG. 6 may be part of a single continuous sidewall that extends around the closed shape of the opening 64 (as shown in FIG. 6A). The opening 64 may be representative of a large number of substantially identical openings formed at the process stage of FIG. 6 and utilized for fabricating NAND memory cells of a NAND memory array. The term "substantially identical" means identical to within reasonable tolerances of fabrication and measurement.

Figure 7:
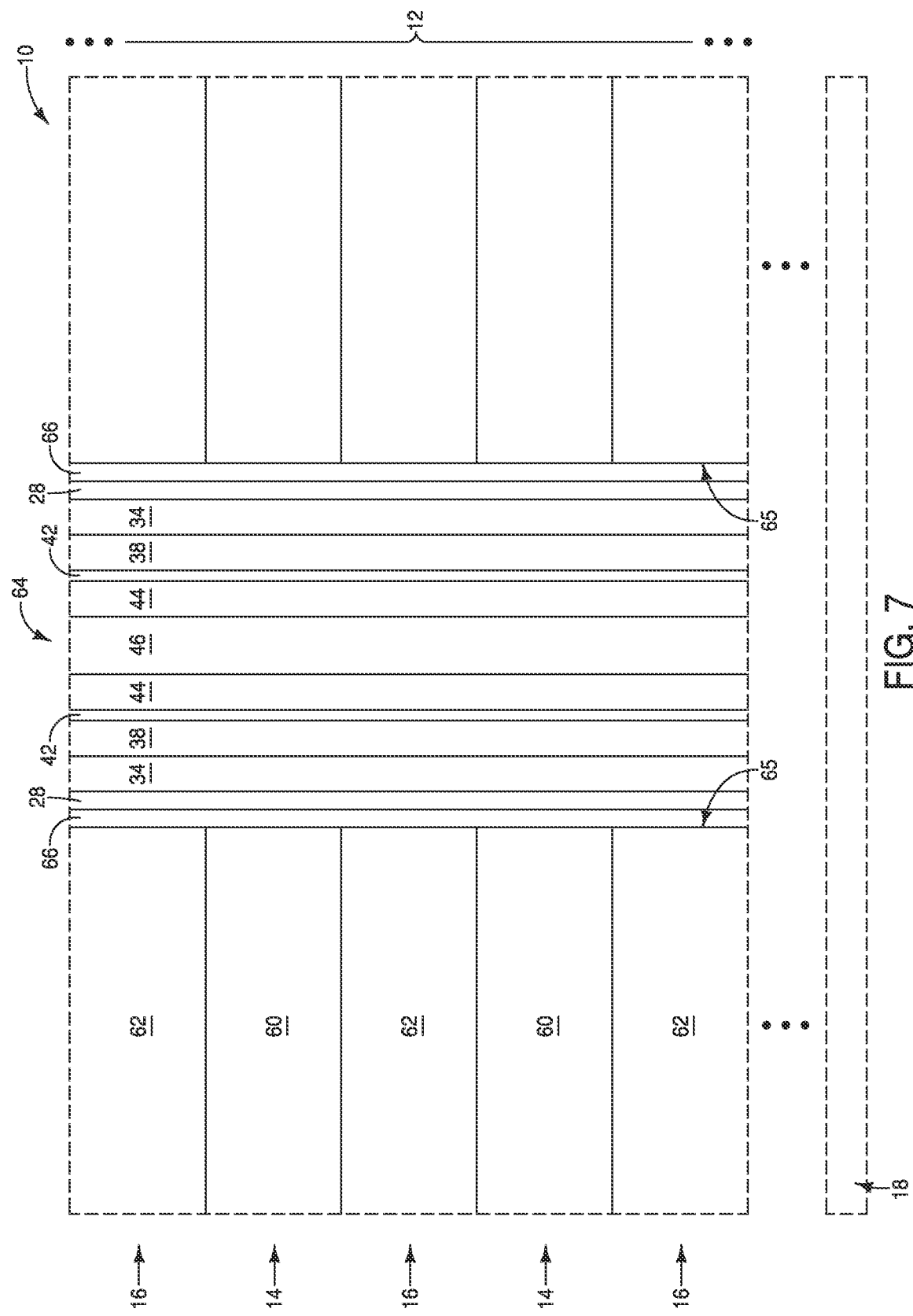
FIGS. 7-14 are diagrammatic cross-sectional side views of the region of the integrated assembly of FIG. 5 shown at example sequential process stages of an example method for forming an example NAND memory array. The process stage of FIG. 7 follows the process stage of FIG. 6.

Referring to FIG. 7, a third material 66 is formed along the sidewalls 65 of the opening 64. The third material 66 lines the opening 64, and narrows the opening. The third material 66 may comprise any suitable composition(s); and in some embodiments may comprise, consist essentially of, or consist of one or more of boron, germanium and silicon (e.g., polycrystalline silicon). In embodiments in which the third material comprises polycrystalline silicon, carbon (and/or other materials) may be incorporated into the polycrystalline silicon to improve resistance of the polycrystalline silicon to etches utilized at subsequent process stages.

Dielectric-barrier material 28, charge-blocking material 34, charge-storage material 38, charge-passage material (gate dielectric material) 42, channel material 44, and insulative material 46 are formed within the narrowed opening 64. In some embodiments, the materials 28, 34, 38, 42, 44 and 46 may be considered to be formed to be adjacent to one another, and to extend vertically through the stack 12.

The dielectric-barrier material 28 may be high-k dielectric material. The term "high-k" means a dielectric constant greater than that of silicon dioxide. In some embodiments, the dielectric-barrier material 28 may comprise, consist essentially of, or consist of one or more of aluminum oxide (AlO), hafnium oxide (HfO), hafnium silicate (HfSiO), zirconium oxide (ZrO) and zirconium silicate (ZrSiO); where the chemical formulas indicate primary constituents rather than specific stoichiometries.

The charge-blocking material 34 may comprise any suitable composition(s); and in some embodiments may comprise, consist essentially of, or consist of one or both of silicon oxynitride (SiON) and silicon dioxide ($SiO_2$).

The charge-storage material 38 may comprise any suitable composition(s). In some embodiments the charge-storage material 38 may comprise charge-trapping materials; such as, for example, silicon nitride, silicon oxynitride, conductive nanodots, etc. For instance, in some embodiments the charge-storage material 38 may comprise, consist essentially of, or consist of silicon nitride. In alternative embodiments, the charge-storage material 38 may be configured to include floating gate material (such as, for example, polycrystalline silicon).

The charge-passage material (gate dielectric material, tunneling material) 42 may comprise any suitable composition(s). In some embodiments, the charge-passage material 42 may comprise, for example, one or more of silicon dioxide, silicon nitride, silicon oxynitride, aluminum oxide, hafnium oxide, zirconium oxide, etc. The charge-passage material 42 may be bandgap-engineered to achieve desired electrical properties; and accordingly may comprise a combination of two or more different materials.

The channel material 44 comprises semiconductor material; and may comprise any suitable composition or combination of compositions. For instance, the channel material 44 may comprise one or more of silicon, germanium, III/V semiconductor materials (e.g., gallium phosphide), semiconductor oxides, etc.; with the term III/V semiconductor material referring to semiconductor materials comprising elements selected from groups III and V of the periodic table (with groups III and V being old nomenclature, and now being referred to as groups 13 and 15). In some embodiments, the channel material 44 may comprise, consist essentially of, or consist of silicon.

The insulative material 46 may comprise any suitable composition(s); and in some embodiments may comprise, consist essentially of, or consist of silicon dioxide.

In the illustrated embodiment of FIG. 7, the channel material 44 is configured as an annular ring which surrounds the insulative material 46. Such configuration of the channel material may be considered to comprise a hollow channel configuration, in that the insulative material 46 is provided within a "hollow" in the annular-ring-shaped channel configuration. In other embodiments (not shown), the channel material may be configured as a solid pillar configuration.

Figure 8:
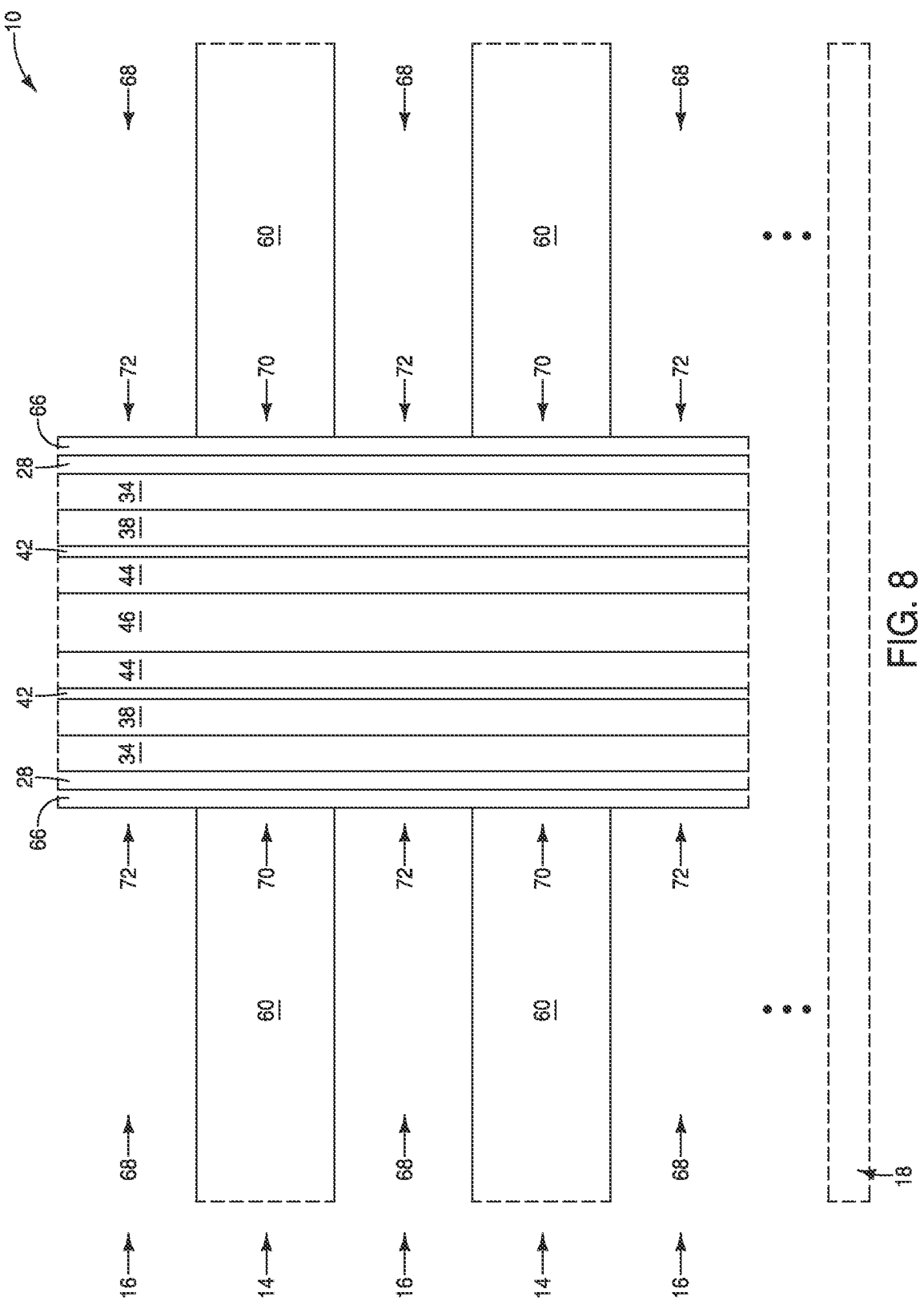

Referring to FIG. 8, the second material 62 (FIG. 7) is removed to leave voids 68. The voids 68 may be referred to as first voids to distinguish them from other voids which are formed at later process stages.

Regions (portions) 72 of the material 66 along the second levels 16 are exposed by the voids 68. Other regions (portions) 70 of the material 66 along the first levels 14 are not exposed by the voids 68. In some embodiments, the regions 70 and 72 may be referred to as first and second regions, respectively.

Figure 9:
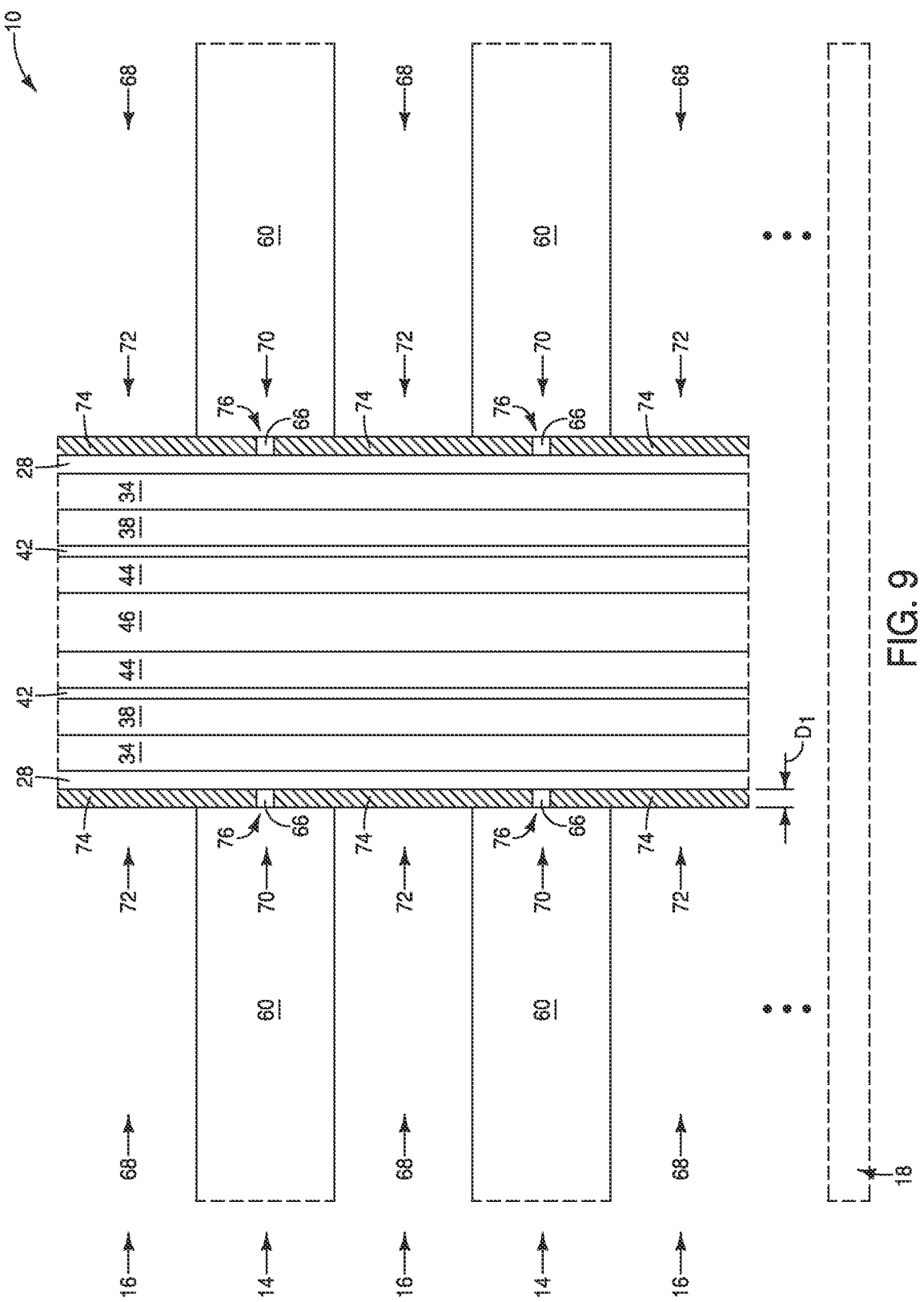

Referring to FIG. 9, the exposed regions 72 of the third material 66 (i.e., the portions of the third material along the second levels 16) are converted to a conductive fourth material 74. In the illustrated embodiment, some of the third material 66 along the first levels 14 (i.e., some of the portions 70 of the third material 66) is also converted to the fourth material 74. The remaining regions of the third material 66 are plugs 76 which are approximately vertically-centered along the first levels 14. The fourth material 74 may have any suitable horizontal dimension Di along the cross-section of FIG. 9; and in some embodiments may have a horizontal dimension Di within a range of from about 1 nm to about 10 nm.

The conductive material 74 may comprise any suitable composition(s); and in some embodiments may comprise, consist essentially of, or consist of one or more metals (e.g., one or more of cobalt, molybdenum, nickel, ruthenium, tantalum, titanium and tungsten).

The conductive material 74 may be formed utilizing one or more metal-containing precursors flowed into the voids 68. The metal-containing precursor(s) may be metal-halide material(s) and/or metal-organic material(s). In some embodiments, the conductive material 74 may comprise, consist essentially of, or consist of tungsten; and may be formed utilizing a precursor comprising a tungsten halide (e.g., tungsten fluoride, $WF_6$). As another example, the conductive material 74 may comprise, consist essentially of, or consist of titanium; and may be formed utilizing a precursor comprising a titanium halide (e.g., titanium chloride, $TiCl_4$). The metal-containing precursor(s) may be utilized under any suitable reaction conditions; and in some embodiments may be utilized at a temperature of at least about 300° C., and at a pressure of about atmospheric pressure. In some embodiments, the third material 66 may comprise, consist essentially of, or consist of silicon (e.g., polycrystalline silicon), and the metal-containing precursor(s) may react with such silicon to form the conductive material 74.

The conductive material 74 may be pure metal or may comprise one or more non-metal constituents. In some embodiments, the conductive material 74 may comprise the metal, and in addition may comprise one or more of boron, carbon, nitrogen, oxygen and silicon. Accordingly, one or more metals within the conductive material 74 may be present as metal boride, metal carbide, metal nitride, metal silicide and/or metal oxide. The metal nitride may be formed by incorporating nitridizing (nitriding) species (e.g., $NH_3$) in combination with metal-containing precursor(s) during formation of the material 74; and/or by including nitrogen within the material 66. The metal oxide may be formed by incorporating oxidizing species (e.g., $O_2$ and/or $O_3$) in combination with metal-containing precursor(s) during formation of the material 74 and/or by including oxygen within the material 66. The metal carbide may be formed by incorporating carbon-containing species (e.g., carbon halide) in combination with metal-containing precursor(s) during formation of the material 74 and/or by including carbon within the material 66. The metal boride may be formed by incorporating boron-containing species (e.g., $B_2H_6$) with metal-containing precursor(s) during formation of the material 74 and/or by including boron within the material 66. The metal silicide may be formed by incorporating silicon-containing species (e.g., silane) in combination with metal-containing precursor(s) during formation of the material 74 and/or by including silicon within the material 66.

In some embodiments, the conductive material 74 may comprise, consist essentially of, or consist of one or more of TiSi, TiSiN, W, WSiN, and WN; where the chemical formulas indicate primary constituents rather than specific stoichiometries.

Figure 10:
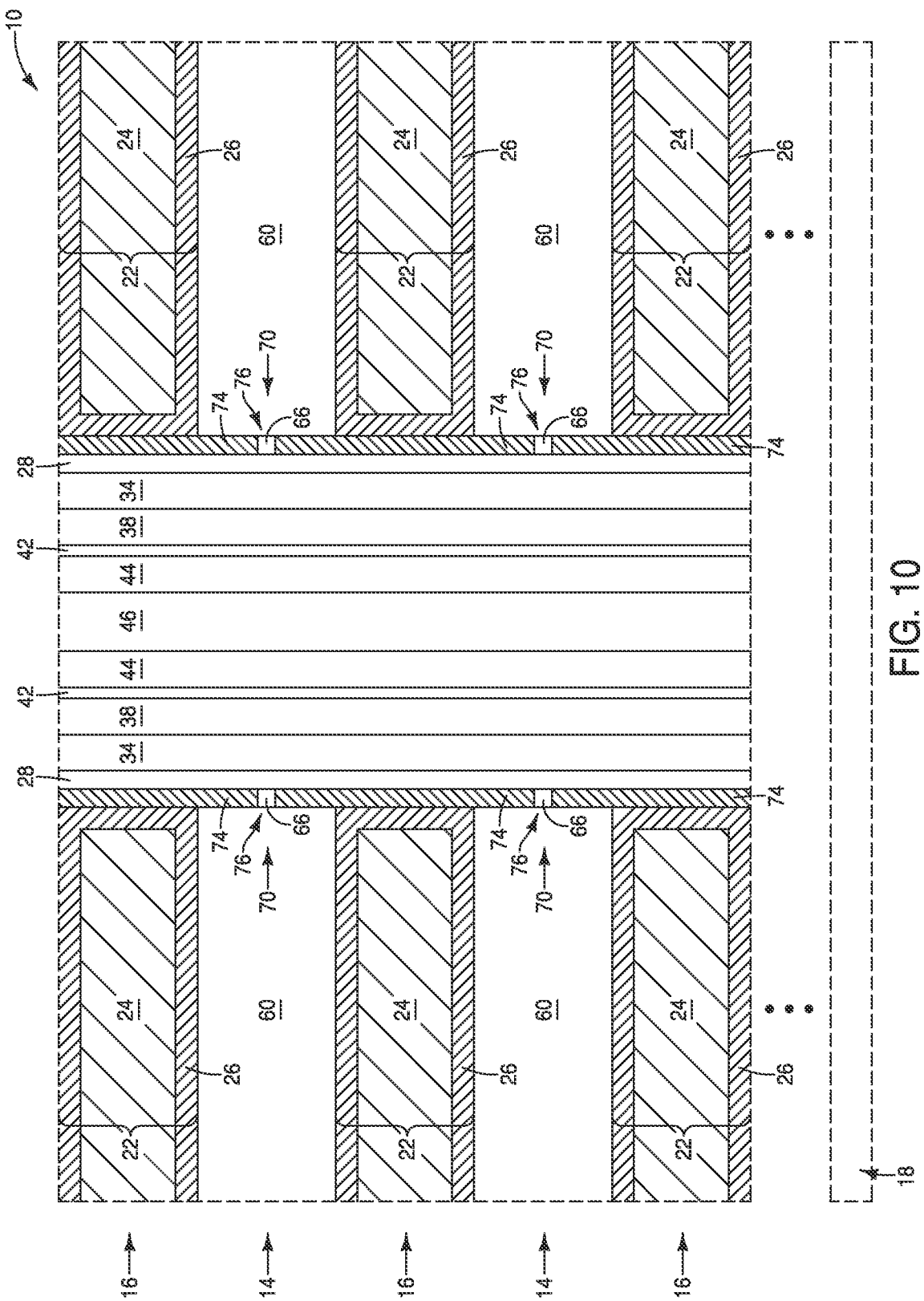

Referring to FIG. 10, conductive structures 22 are formed within the voids 68 (FIG. 9). The conductive structures 22 comprise conductive materials 24 and 26. The conductive materials 24 and 26 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive materials 24 and 26 are compositionally different from one another. In some embodiments, the core material 24 may comprise one or more metals (e.g., may comprise tungsten) and the outer conductive material 26 may comprise one or more metal nitrides (e.g., may comprise titanium nitride). Although the conductive structures 22 are shown comprising two materials, in other embodiments the conductive structures may comprise more than two materials or only a single material.

The conductive structures 22 directly contact the conductive material 74; and in the shown embodiment the outer conductive material 26 (e.g., titanium nitride) directly contacts the conductive material 74.

Figure 11:
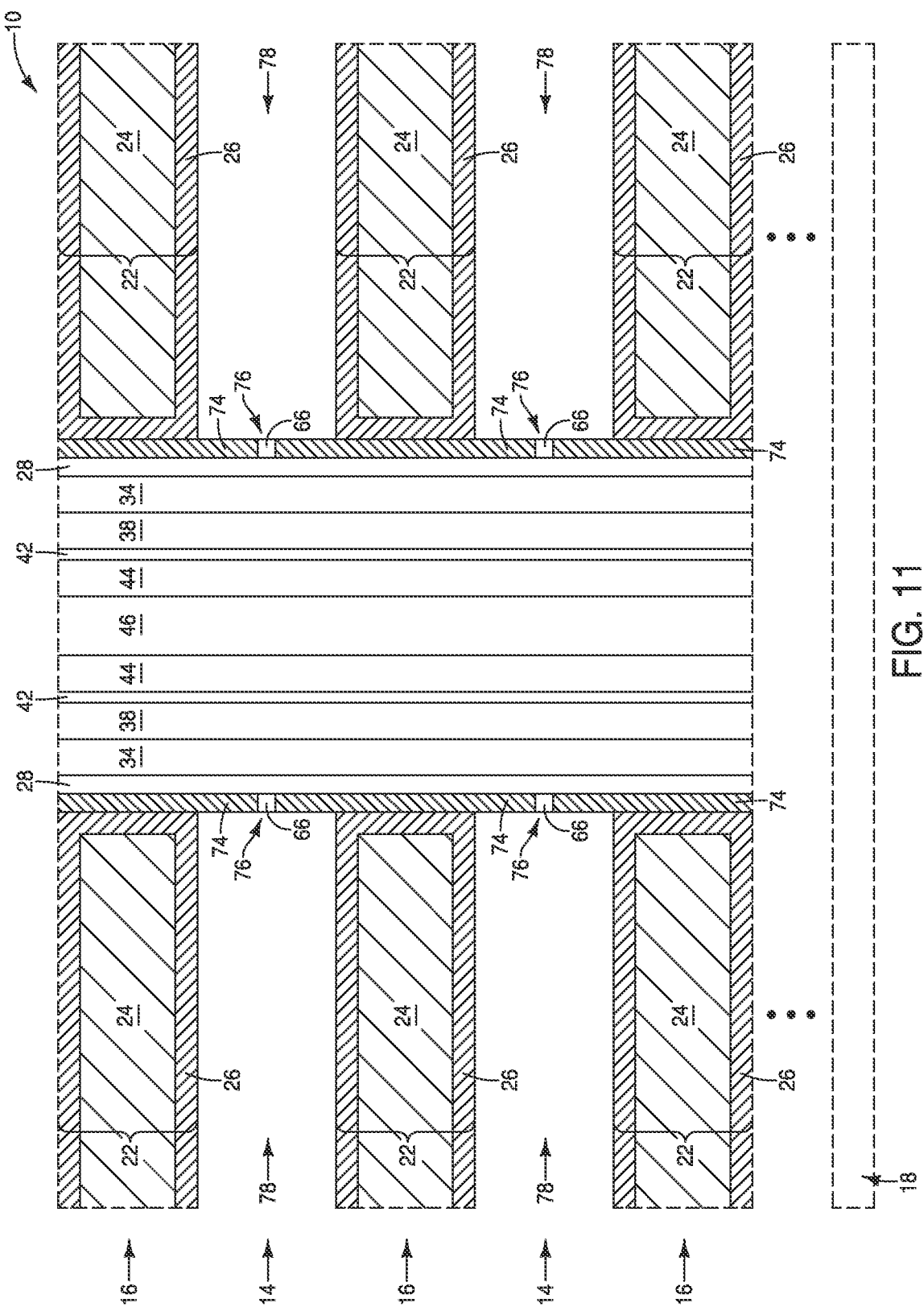

Referring to FIG. 11, the first material 60 (FIG. 10) is removed to form second voids 78.

Figure 12:
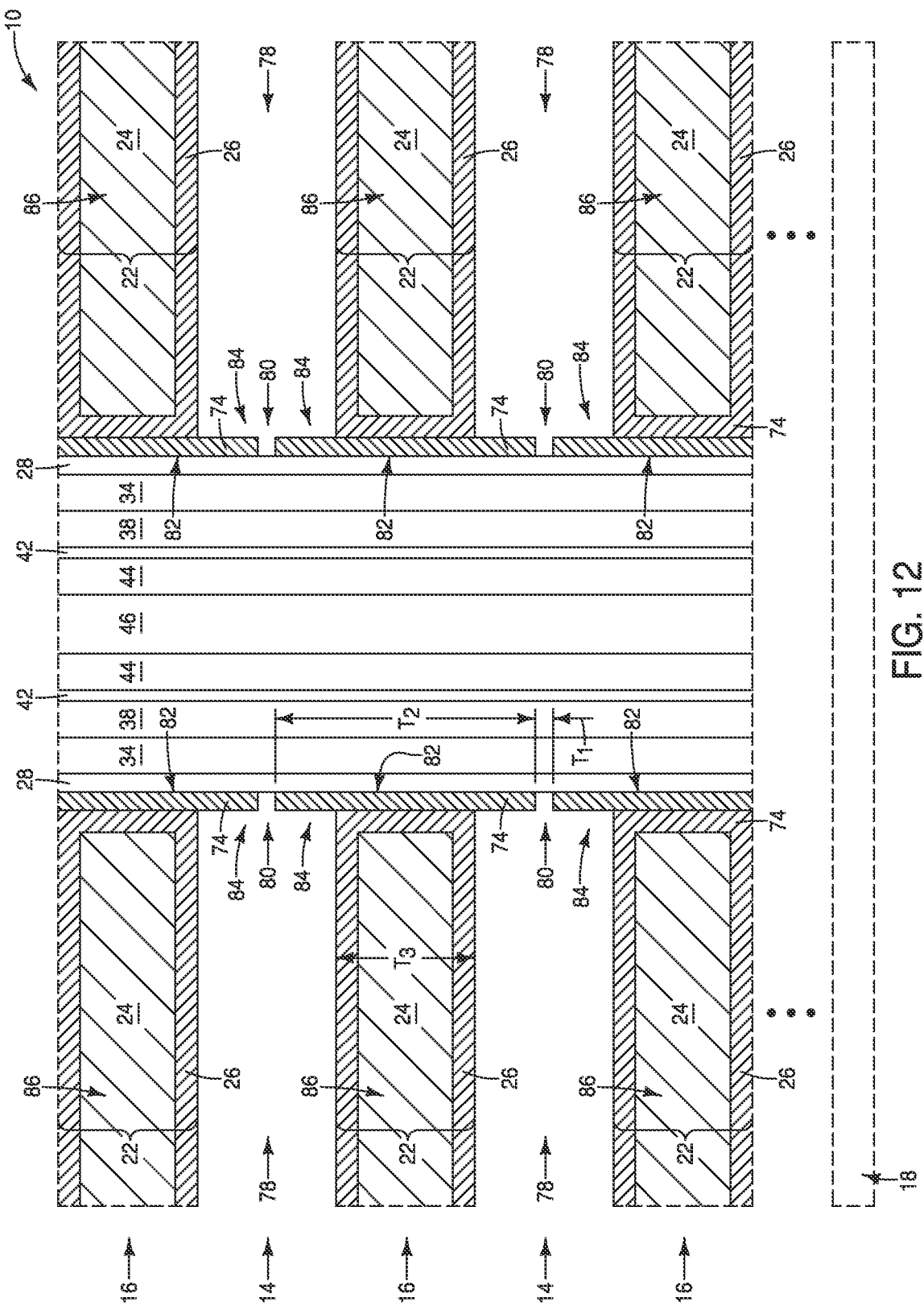

Referring to FIG. 12, the remaining regions of the third material 66 (FIG. 11) are removed to form gaps 80. The conductive fourth material 74 may be considered to be configured as segments 82, with such segments being vertically stacked one atop another, and being vertically spaced from one another by the intervening gaps 80. In some embodiments, the gaps 80 may be considered to be access ports which extend through the conductive material 74.

The gaps 80 may have any suitable vertical thickness (vertical dimension) $T_1$; and in some embodiments such vertical thickness may be within a range of from about 1 nm to about 20 nm.

The conductive structures 22, together with conductive segments 74 directly adjacent such conductive structures, may be considered to be conductive levels (i.e., the levels 16 of FIG. 12 may be conductive levels comprising the structures 22 and the segments 74). In some embodiments, the conductive levels may be considered to be a NAND wordline levels.

Each of the conductive levels 16 comprises a terminal region 84, and a nonterminal region 86 proximate the terminal region. The terminal regions 84 correspond to the conductive segments 82, and the nonterminal regions 86 correspond to the conductive structures 22.

The terminal regions 84 are vertically thicker than the nonterminal regions 86. In the illustrated embodiment, the terminal regions 84 have a vertical thickness (vertical dimension) $T_2$, and the nonterminal regions 86 have a vertical thickness $T_3$. In some embodiments, the vertical thickness $T_2$ will be greater than the vertical thickness $T_3$ by an amount within a range of from about 10% to about 90% of $T_3$.

In some embodiments, the terminal regions 84 may comprise a same composition as regions of the conductive structures 22 directly adjacent such terminal regions. For instance, in some embodiments the conductive material 74 of the terminal regions 84 may comprise titanium nitride, and the conductive material 26 of the nonterminal regions 86 may also comprise titanium nitride. In other embodiments, the terminal regions 84 may comprise a different composition than the regions of the conductive structures 22 directly adjacent such terminal regions. For instance, in some embodiments the conductive material 26 of the nonterminal regions 86 may comprise, consist essentially of, or consist of titanium nitride; and the conductive material 74 of the terminal regions 84 may comprise, consist essentially of, or consist of one or more of TiSi, TiSiN, W, WSiN, and WN; where the chemical formulas indicate primary constituents rather than specific stoichiometries.

In the illustrated embodiment of FIG. 12, the nonterminal regions 86 are substantially vertically-centered relative to the terminal regions 84 along each of the conductive levels 16. The term "substantially vertically-centered" means vertically-centered to within reasonable tolerances of fabrication and measurement.

Figure 13:
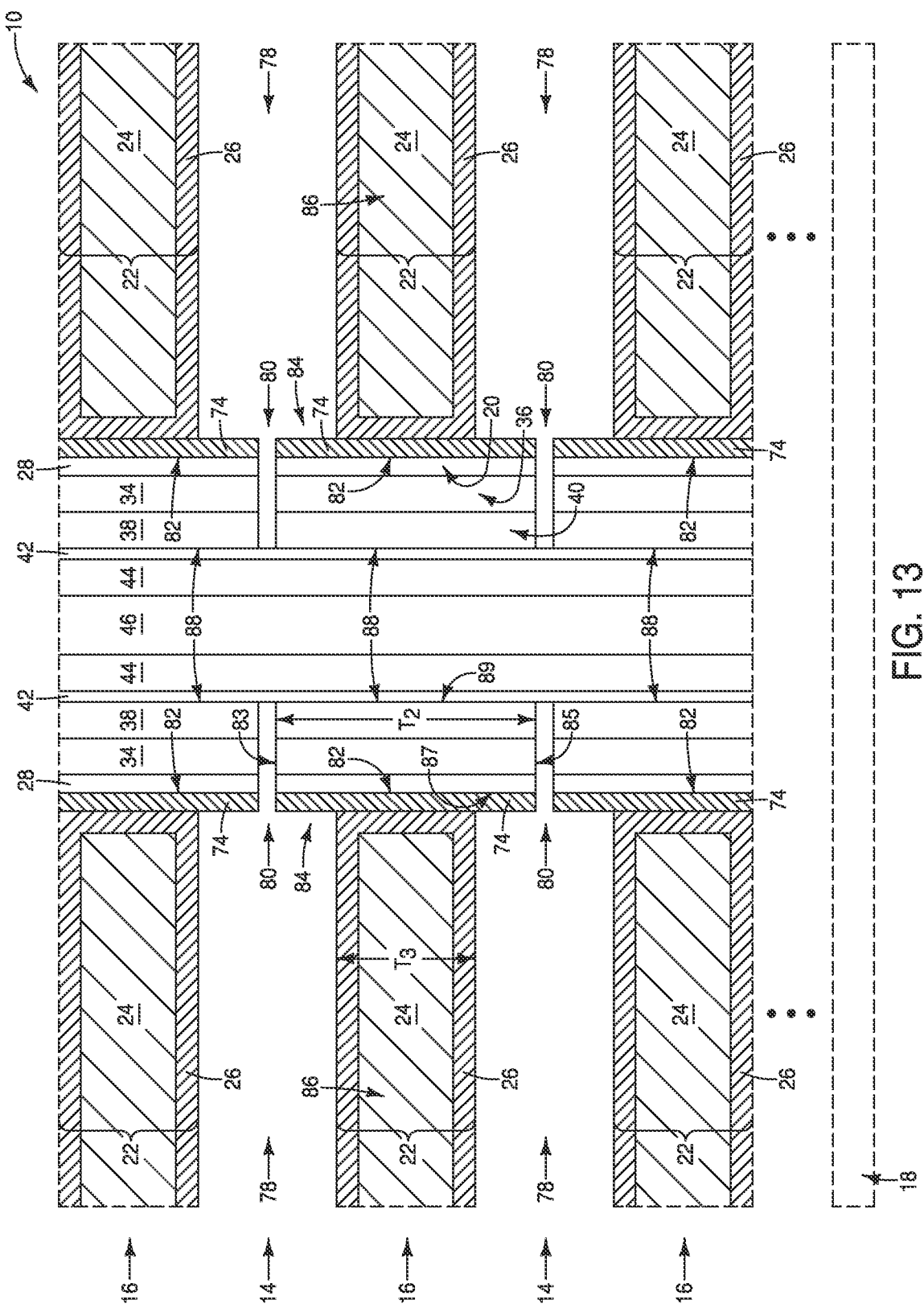

Referring to FIG. 13, the gaps 80 are extended through the dielectric-barrier material 28, the charge-blocking material 34 and the charge-storage material 38 to form blocks 88 comprising the materials 28, 34 and 38. The blocks 88 are vertically spaced from one another by the intervening gaps 80. The blocks have a vertical thickness which is substantially the same as the vertical thickness $T_2$ of the segments 82 of the conductive material 74; with the term "substantially the same" meaning the same to within reasonable tolerances of fabrication and measurement.

In the illustrated embodiment, each of the blocks 88 has a substantially horizontal top surface 83 and a substantially horizontal bottom surface 85 (with the term "substantially horizontal" meaning horizontal to within reasonable tolerances of fabrication and measurement). The cross-sectional view of FIG. 13 also shows each of the blocks 88 to have a pair of substantially vertical sidewall surfaces 87 and 89 which are on opposing sides of the blocks relative to one another, and which extend between the substantially horizontal top and bottom surfaces 83 and 85.

In some embodiments, the dielectric-barrier material 28 within the blocks 88 may be considered to be configured as first segments 20, the charge-blocking material 34 within the blocks 88 may be considered to be configured as second segments 36, and the charge-storage material within the blocks 88 may be considered to be configured as third segments 40. The first, second and third segments 20, 36 and 40 may be considered to have first, second and third vertical thicknesses, respectively; with such first, second and third vertical thicknesses being about the same as one another, and being about the same as the vertical thickness $T_2$ of the terminal regions 84 (with the term "about the same" meaning the same to within reasonable tolerances of fabrication and measurement).

In the illustrated embodiment of FIG. 13, the gaps 80 do not penetrate through the tunneling material 42. Accordingly, the tunneling material 42 and the channel material 44 remain as linear structures which extend vertically through the alternating levels 14 and 16. In other embodiments (described below with reference to FIG. 16) the gaps 80 may extend through the tunneling material 42.

Figure 14:
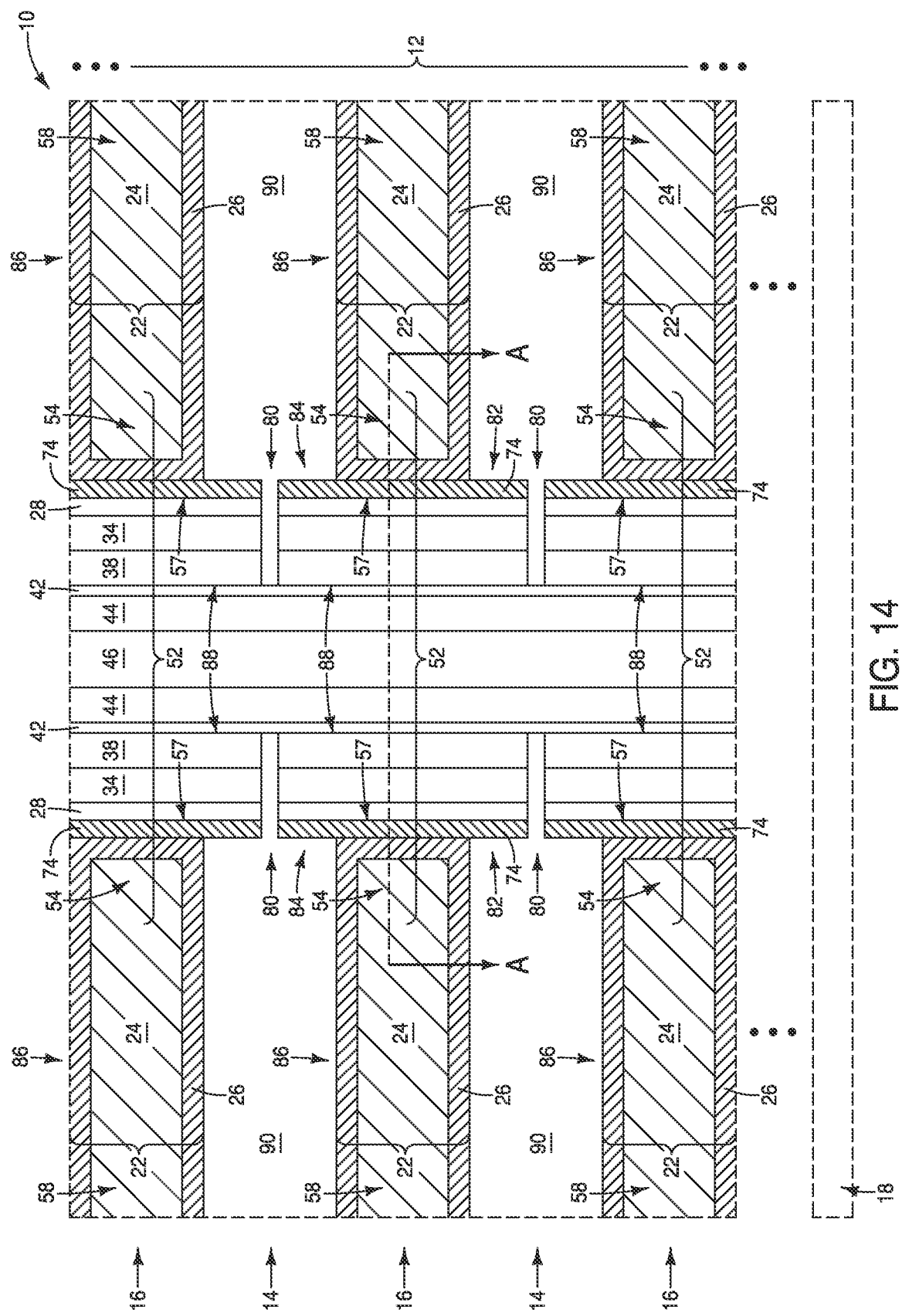

Referring to FIG. 14, insulative material 90 is formed within the voids 78 (FIG. 13). The insulative material 90 may comprise any suitable composition(s); and in some embodiments may comprise, consist essentially of, or consist of silicon dioxide. The insulative material 90 may be referred to as a fifth material to distinguish it from the first, second, third and fourth materials 60, 62, 66 and 74 described above.

The levels 14 and 16 of FIG. 14 may be considered to be alternating insulative levels and conductive levels (e.g., NAND wordline levels), respectively.

NAND memory cells 52 comprise the dielectric barrier material 28, charge-blocking material 34, charge-storage material 38, gate dielectric material 42 and channel material 44. The illustrated NAND memory cells 52 form a portion of a vertically-extending string of memory cells. Such string may be representative of a large number of substantially identical NAND strings formed during fabrication of a NAND memory array (with the term "substantially identical" meaning identical to within reasonable tolerances of fabrication and measurement).

Each of the NAND memory cells 52 includes a control gate region 54 proximate the dielectric-barrier material 28; with the control gate regions including the terminal regions 84 of the conductive levels 16. The control gate regions 54 comprise control gates analogous to those described above with reference to FIGS. 1-4. The conductive levels 16 comprise regions 58 adjacent to (proximate) the control gate regions 54. The regions 58 may be referred to as second regions, or as wordline regions; and include the nonterminal regions 86 of the conductive levels.

In the embodiment of FIG. 14, the control gate regions 54 may be considered to comprise front surfaces 57 which face the dielectric-barrier material 28. Such front surfaces have about the same vertical thickness as the materials 28, 34 and 38. Accordingly, the entirety of the charge-storage material 38 of a memory cell 52 may be along the front surface 57 of the control gate region 54 associated with such memory cell. Such may enable the charge within the charge-storage region to be well-controlled by the associated control gate region 54. Also, the vertically-extending segments 82 (i.e., the terminal segments 84) of the control gate regions may enable the control gate regions to be vertically wider (thicker) than wordline regions 58 adjacent such control gate regions. The vertically wider control gate regions and vertically narrower wordline regions can enable a larger volume of charge-storage material 38 to be coupled with the control gate regions than would be achievable if the control gate regions were kept to the same vertical thickness as the wordline regions 58, while enabling the wordline regions 58 to be vertically-spaced by larger distances than would be achievable if the wordline regions were kept to the same vertical thickness as the control gate regions 54. Relatively large vertical spacing between the wordline regions 58 may advantageously reduce capacitive coupling between vertically-neighboring wordline regions.

Figure 14A:
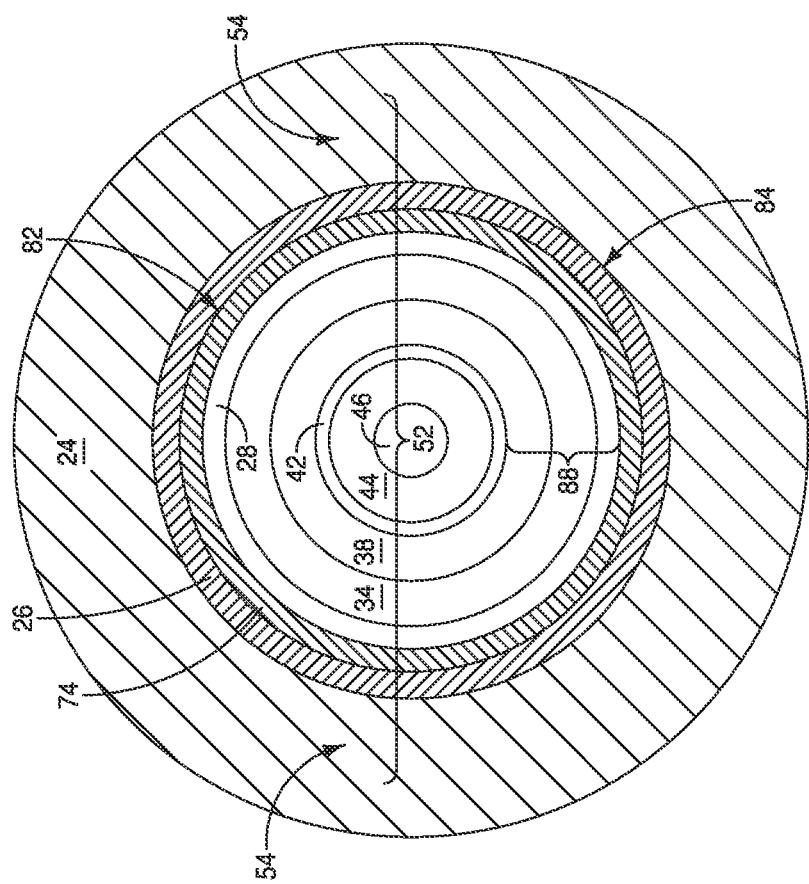
FIG. 14A is a diagrammatic cross-sectional top-down view along the line A-A of FIG. 14.

FIG. 14A shows a cross-section along the line A-A of FIG. 14, and shows a representative segment 82 of the conductive material 74 extending entirely around the materials 28, 34, 38, 42, 44 and 46 of the memory cell 52. Also, the view of FIG. 14A shows that the block 88 of materials 28, 34 and 38 is an annular ring (a toroid shape) that extends around the channel material 44 (and in the shown embodiment also extends around the tunneling material 42).

An advantage of the configuration of FIGS. 14 and 14A may be that the memory cells 52 may be formed to high packing density.

In the embodiment of FIG. 14, the voids 78 (FIG. 13) are entirely filled with the insulative material 90. In other embodiments, the voids may be only partially filled with such insulative material.

Figure 15:
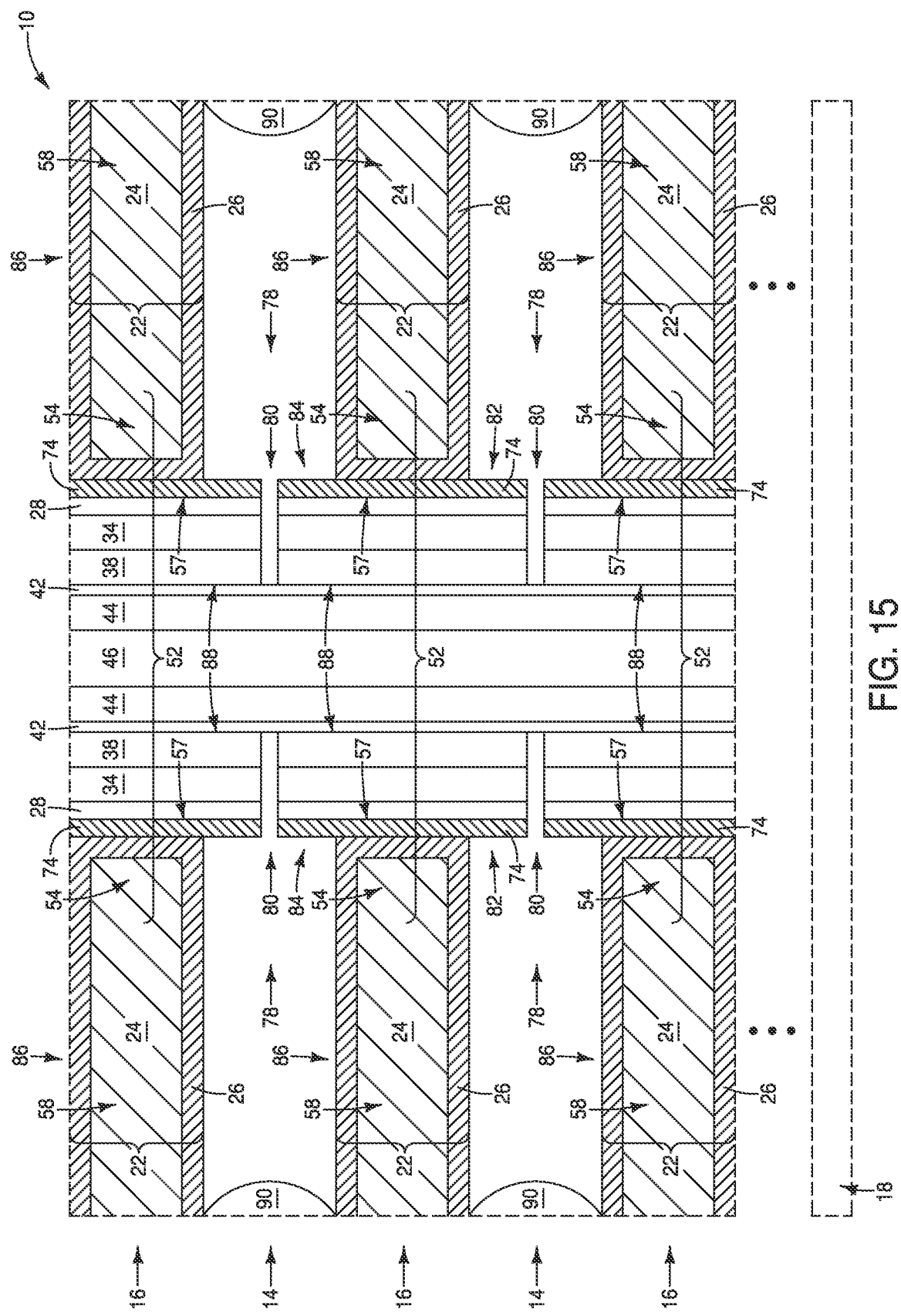
FIG. 15 is a diagrammatic cross-sectional side view of a region of an integrated assembly shown at an example process stage alternative to that of FIG. 14.

FIG. 15 shows a configuration analogous to that of FIG. 14, but in which the voids 78 are only partially filled with the insulative material 90. Accordingly, portions of the voids 78 remain within the insulative levels 14. The remaining portions of the voids 78 are capped with the insulative material 90. The voids 78 may be filled with air or any other suitable gas.

An advantage of the configuration of FIG. 15 (i.e., a configuration having voids within the insulative levels 14) is that such may alleviate capacitive coupling between vertically-neighboring materials in the event that such capacitive coupling is found to be problematic.

Figure 16:
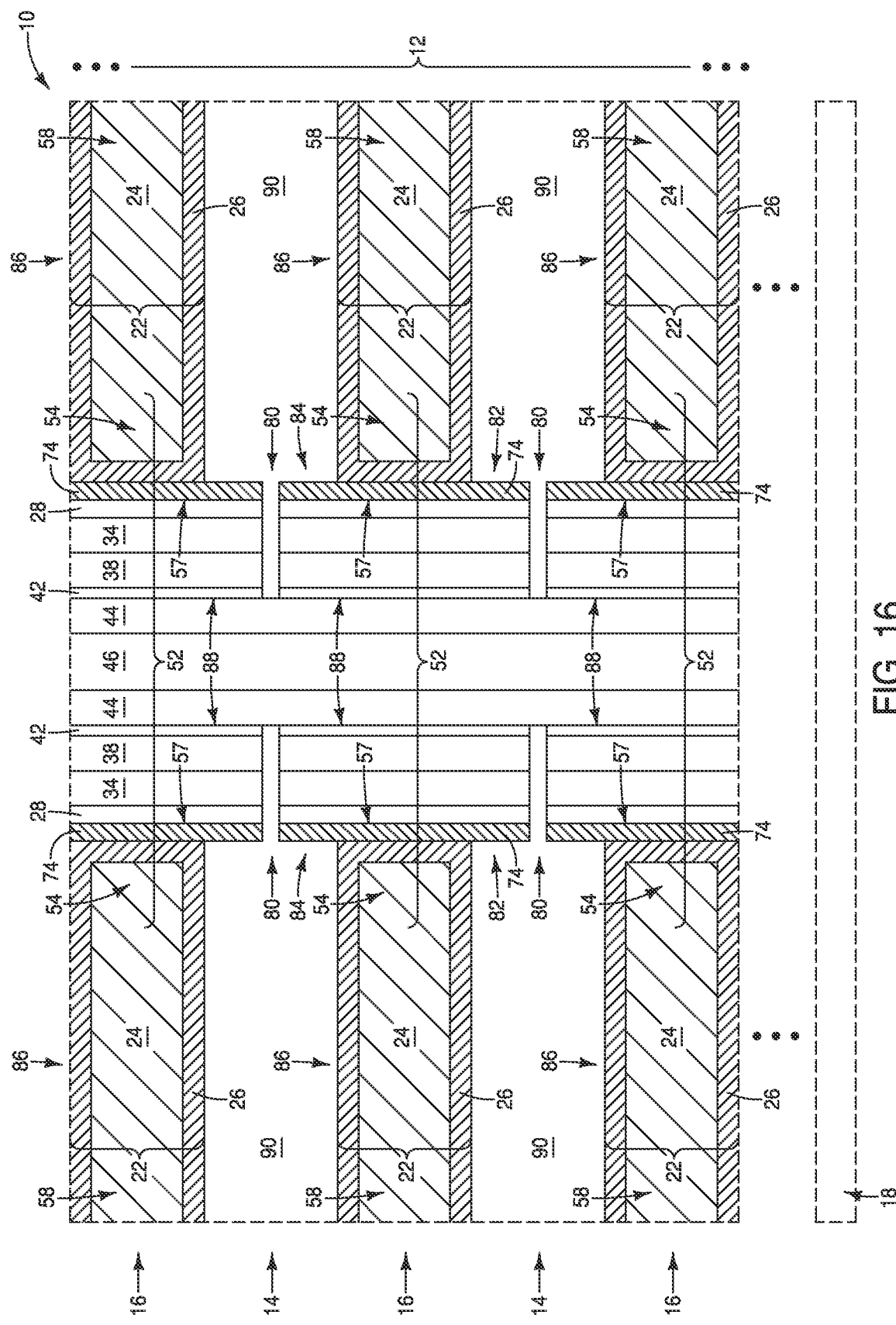
FIG. 16 is a diagrammatic cross-sectional side view of a region of an integrated assembly shown at an example process stage alternative to that of FIG. 14.

As discussed above with reference to FIG. 13, in some embodiments the gaps 80 may be extended through the tunneling material 42, in addition to being extended through the materials 28, 34 and 38. Accordingly, the tunneling material 42 may be incorporated into the blocks 88. FIG. 16 shows an embodiment analogous to that of FIG. 14, but in which the blocks 88 also include the tunneling material (charge-passage material, gate dielectric material) 42.

The channel material 44 is "flat" (i.e., is of substantially continuous thickness, and is substantially vertically straight) in the configurations of FIGS. 14-16, as opposed to being undulating. The flat channel material may positively impact string current as compared to non-flat configurations. In some embodiments, the configuration of the channel material 44 may be referred to as a "flat configuration". Notably, the segments 40 of the charge-storage material 38 are also "flat"; and may be considered to each be in a "flat configuration" (the segments 40 are labeled in FIG. 13). The flat segments 40 may have a favorable charge distribution as compared to non-flat segments of the charge-storage material.

In operation, the charge-storage material 38 may be configured to store information in the NAND memory cells 52 of the various embodiments described herein. The value (with the term "value" representing one bit or multiple bits) of information stored in an individual memory cell may be based on the amount of charge (e.g., the number of electrons) stored in a charge-storage region of the memory cell. The amount of charge within an individual charge-storage region may be controlled (e.g., increased or decreased), at least in part, based on the value of voltage applied to an associated gate 54, and/or based on the value of voltage applied to the channel material 44.

The charge-passage material (tunneling material, gate dielectric material) 42 forms tunneling regions of the memory cells 52. Such tunneling regions may be configured to allow desired migration (e.g., transportation, passage) of charge (e.g., electrons) between the charge-storage material 38 and the channel material 44. The tunneling regions may be configured (i.e., engineered) to achieve a selected criterion, such as, for example, but not limited to, an equivalent oxide thickness (EOT). The EOT quantifies the electrical properties of the tunneling regions (e.g., capacitance) in terms of a representative physical thickness. For example, EOT may be defined as the thickness of a theoretical silicon dioxide layer that would be required to have the same capacitance density as a given dielectric, ignoring leakage current and reliability considerations.

The charge-blocking material 34 adjacent the charge-storage material 38 may provide a mechanism to block charge from flowing from the charge-storage material 38 to the associated gates 54.

The dielectric-barrier material (high-k material) 28 provided between the charge-blocking material 34 and the associated gates 54 may be utilized to inhibit back-tunneling of charge carriers from the gates 54 toward the charge-storage material 38. In some embodiments, the dielectric-barrier material 28 may be considered to form dielectric-barrier regions within the memory cells 52.

The embodiments described herein advantageously provide methodology which may be utilized to tailor gate lengths (i.e., the vertical thicknesses of the terminal regions of the control gates 54), with such gate lengths being approximate the lengths of storage nodes (i.e., the segments 40 of the charge-storage material 38) within NAND memory cells (i.e., the memory cells 52). In some embodiments, the conductive structures 22 may have very little titanium nitride 26 utilized therein, which can improve resistance along the wordline regions 58 of the conductive structures. The titanium nitride 26 may be utilized primarily as a nucleation material for growing the tungsten 24 within the conductive structures 22 as the conductive material 74 may be chosen to have a desired workfunction within the NAND memory cells 52, desired conductivity, desired adhesion to adjacent materials, etc.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated structure having a vertical stack of alternating insulative levels and conductive levels. The conductive levels have terminal regions, and have nonterminal regions proximate the terminal regions. The terminal regions are vertically thicker than the nonterminal regions, and have a first vertical thickness. Dielectric-barrier material is adjacent to the terminal regions. The dielectric-barrier material is configured as first segments which are vertically stacked one atop another and which are vertically spaced from one another. The first segments have a second vertical thickness. Charge-blocking material is adjacent to the dielectric-barrier material. The charge-blocking material is configured as second segments which are vertically stacked one atop another and which are vertically spaced from one another. The second segments have a third vertical thickness. Charge-storage material is adjacent to the charge-blocking material. The charge-storage material is configured as third segments which are vertically stacked one atop another and which are vertically spaced from one another. The third segments have a fourth vertical thickness. The first, second, third and fourth vertical thicknesses are about the same as one another. Charge-passage material is adjacent to the charge-storage material. Channel material is adjacent to the charge-passage material.

Some embodiments include a NAND memory array having a vertical stack of alternating insulative levels and conductive (wordline) levels. The conductive levels include terminal regions and nonterminal regions proximate the terminal regions. The terminal regions are vertically thicker than the nonterminal regions, and are configured as segments which are vertically stacked one atop another and which are vertically spaced from one another. Blocks are adjacent to the segments and have approximately a same vertical thickness as the segments. The blocks include high-k dielectric material, charge-blocking material and charge-storage material. Channel material extends vertically along the stack and is adjacent to the blocks.

Some embodiments include a method of forming an integrated structure. A vertical stack of alternating first and second levels is formed. The first levels comprise first material and the second levels comprise second material. An opening is formed to extend through the stack. Third material is formed within the opening to narrow the opening. Dielectric-barrier material, charge-blocking material, charge-storage material, charge-passage material and channel material are formed within the narrowed opening. The second material is removed to leave first voids and to expose regions of the third material along the second levels. The exposed regions of the third material along the second levels is converted to a conductive fourth material. The converting also converts some of the third material along the first levels to the conductive fourth material. Conductive structures are formed within the first voids and directly against the conductive fourth material. The first material is removed to leave second voids. Remaining regions of the third material are exposed at ends of the second voids. The remaining regions of the third material are removed to form gaps. The gaps are between segments of the conductive fourth material. The gaps are extended through the dielectric-barrier material, the charge-blocking material and the charge storage material to form blocks comprising the dielectric-barrier material, the charge-blocking material and the charge storage material. The blocks are vertically spaced from one another.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated structure, comprising:
   a vertical stack of alternating insulative levels and conductive levels;
   the conductive levels having terminal regions and non-terminal regions proximate the terminal regions;
   the non-terminal regions comprising a conductive core material layer and an outer conductive material layer different than the conductive core material layer, the non-terminal regions having a first vertical thickness extending from a respective first adjacent insulative level to a respective second adjacent insulative level;
   the terminal regions comprising only one conductive material layer different than the conductive core material layer and the outer conductive material layer having a second vertical thickness being vertically thicker than the first vertical thickness and extending from the respective first adjacent insulative level to the respective second adjacent insulative level;
   dielectric-barrier material comprising the second vertical thickness adjacent the terminal regions;
   charge-blocking material adjacent the dielectric-barrier material;
   charge-storage material adjacent the charge-blocking material; and
   channel material adjacent the charge-storage material.

2. The integrated structure of claim 1 wherein the terminal regions comprise vertical dimensions and wherein the charge-blocking material comprises the same vertical dimensions.

3. The integrated structure of claim 1 wherein the terminal regions comprise vertical dimensions and wherein the charge-storage material comprises the same vertical dimensions.

4. The integrated structure of claim 1 wherein the dielectric-barrier material comprises vertical dimensions and wherein the charge-blocking material comprises the same vertical dimensions.

5. The integrated structure of claim 1 wherein the dielectric-barrier material comprises vertical dimensions and wherein the charge-storage material comprises the same vertical dimensions.

6. The integrated structure of claim 1 wherein the charge-blocking material comprises vertical dimensions and wherein the charge-storage material comprises the same vertical dimensions.

7. The integrated structure of claim 1 wherein the terminal regions comprise a same composition as the nonterminal regions.

8. The integrated structure of claim 1 wherein the terminal regions comprise a different composition than the nonterminal regions.

9. A NAND memory array, comprising:
- a vertical stack of alternating insulative levels and conductive levels;
- the conductive levels including terminal regions and nonterminal regions proximate the terminal regions, wherein:
  - the non-terminal regions comprise a conductive core material layer and an outer conductive material layer different than the conductive core material layer, the non-terminal regions having a first vertical thickness extending from a respective first adjacent insulative level to a respective second adjacent insulative level; and
  - the terminal regions comprise only one conductive material layer different than the conductive core material layer and the outer conductive material layer having a second vertical thickness being vertically thicker than the first vertical thickness and extending from the respective first adjacent insulative level to the respective second adjacent insulative level;
- blocks adjacent the conductive levels, the blocks including high-k dielectric material comprising the second vertical thickness, charge-blocking material and charge-storage material; and
- channel material extending vertically along the stack and being adjacent the blocks.

10. The NAND memory array of claim 9 wherein the terminal regions comprise a vertical thickness and wherein the blocks comprise the same vertical thickness.

11. The NAND memory array of claim 9 wherein the terminal regions comprise a vertical thickness and wherein the charge-blocking material comprises the same vertical thickness.

12. The NAND memory array of claim 9 wherein the terminal regions comprise a vertical thickness and wherein the charge-storage material comprises the same vertical thickness.

13. The NAND memory array of claim 9 wherein the blocks have substantially horizontal top and bottom surfaces.

14. The NAND memory array of claim 9 wherein each of the blocks, along a cross-section, has a pair of opposing substantially vertical sidewall surfaces extending from one of the substantially horizontal top surfaces to one of the substantially horizontal bottom surfaces.

15. The NAND memory array of claim 9 wherein the blocks are vertically spaced from one another by intervening gaps having vertical thicknesses within a range of from about 1 nm to about 20 nm.

16. The NAND memory array of claim 9 wherein charge-passage material extends vertically along the stack and is between the blocks and the channel material.

* * * * *